US006853270B2

(12) United States Patent
Shibahara (10) Patent No.: US 6,853,270 B2
(45) Date of Patent: Feb. 8, 2005

(54) SURFACE ACOUSTIC WAVE FILTER WITH SPLIT CENTER IDT AND SPECIFIC WEIGHTING AND COMMUNICATION APPARATUS

(75) Inventor: Teruhisa Shibahara, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/646,287

(22) Filed: Aug. 22, 2003

(65) Prior Publication Data

US 2004/0066254 A1 Apr. 8, 2004

(30) Foreign Application Priority Data

Aug. 22, 2002 (JP) ........................................ 2002-242260
Jun. 27, 2003 (JP) ........................................ 2003-184433

(51) Int. Cl.[7] .............................................. H03H 9/64
(52) U.S. Cl. ........................ 333/195; 333/196; 333/133; 310/313 D
(58) Field of Search ................................ 333/193–196, 333/133; 310/313 B, 313 D (56) References Cited

U.S. PATENT DOCUMENTS 5,835,990 A   11/1998  Saw et al. ............... 310/313 D

2002/0021195 A1    2/2002  Takamine .................... 333/195
2002/0145361 A1 * 10/2002  Shibata et al. .......... 310/313 C

FOREIGN PATENT DOCUMENTS

DE   198 18 826 A1   11/1999
EP   1 168 611 A2    1/2002
JP   11-97966    *   4/1999

* cited by examiner

Primary Examiner—Barbara Summons
(74) Attorney, Agent, or Firm—Keating & Bennett, LLP (57) ABSTRACT

A surface acoustic wave filter includes a first reflector, a first IDT, a second IDT, a third IDT, and a second reflector arranged in that order on a piezoelectric substrate. The first IDT and the third IDT, connected in parallel, are together also connected to an unbalanced signal terminal. The second IDT includes two separate comb-like electrodes arranged in the direction of propagation of a surface acoustic wave, and electrically connected in series to each other at a serial junction. The comb-like electrodes are respectively connected to balanced signal terminals. The outermost electrode finger of the first IDT is connected to the unbalanced signal terminal, and the outermost electrode finger of the third IDT is grounded. The first IDT only or both the first IDT and the third IDT are weighted so that the number of excitation regions of the surface acoustic wave between the second IDT and the first IDT becomes equal to the number of excitation regions of the surface acoustic wave between the second IDT and the third IDT.

19 Claims, 9 Drawing Sheets

SURFACE ACOUSTIC WAVE FILTER WITH SPLIT CENTER IDT AND SPECIFIC WEIGHTING AND COMMUNICATION APPARATUS

BACKGROUND OF THE INVENTION

1. Field of the Invention

The present invention relates to surface acoustic wave filters and, more particularly, to a surface acoustic wave filter having a balanced-unbalanced transformation function.

2. Description of the Related Art

Technological advances in the miniaturization and lightweight design of communication apparatuses such as mobile telephones has been dramatic. As frequency of use increases, surface acoustic wave filters, which are relatively easy to miniaturize, are increasingly used in communication apparatuses. To reduce the number of electronic components and miniaturize the electronic components, efforts have been made to develop components which have a plurality of functions.

Surface acoustic wave filters having a balanced-unbalanced transformation (a so-called balun transformation) function for use in RF stages of the mobile telephone have been actively studied, and are beginning to be used particularly in the GSM (global system for mobile communication) field.

Mobile telephones, depending on the system configuration thereof, require a surface acoustic wave filter having a balun transformation function with the impedance of balanced terminals being at least twice as large as the impedance of an unbalanced signal terminal. Surface acoustic wave filters having the balun transformation function satisfying such a requirement are already in use.

Figure 9:
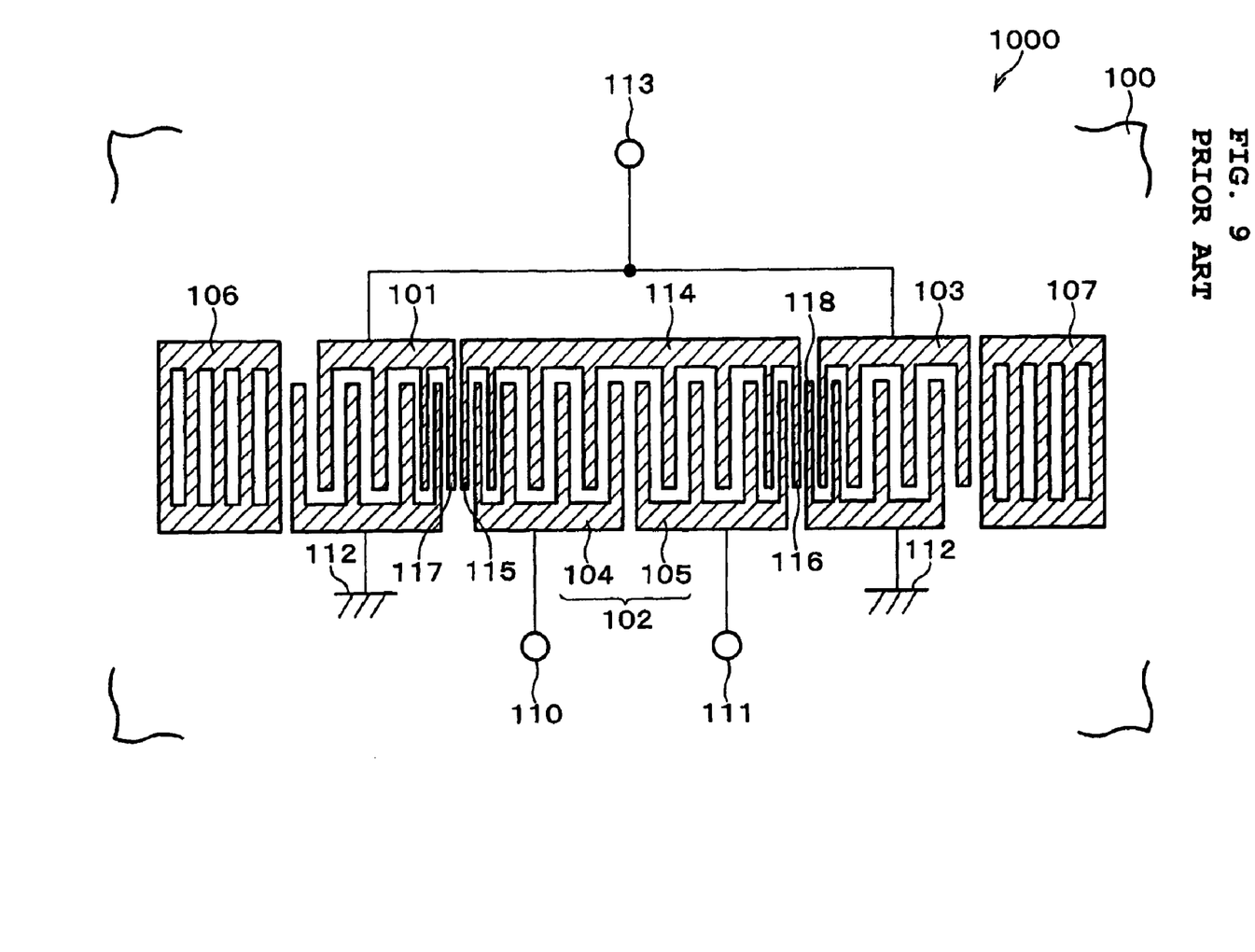
FIG. 9 illustrates the structure of a surface acoustic wave filter in accordance with the prior art.

As shown in FIG. 9, the impedance of the balanced signal terminals of a surface acoustic wave filter 1000 is at least twice as large as the impedance of the unbalanced signal terminal. The surface acoustic wave filter 1000 is a 3-IDT longitudinally coupled surface acoustic wave filter including, on a piezoelectric substrate 100, a reflector 106, interdigital transducers (hereinafter referred to as IDTs), each including a comb-like electrode having a plurality of electrode fingers, namely, an IDT 101, IDTs 102, an IDT 103, and a reflector 107 in that order in the direction of propagation of a surface acoustic wave. Each IDT electrode includes a base portion and a plurality of parallel band-like electrode fingers extending from one edge of the base portion in a direction perpendicular to the base portion. The IDT 102 in the center of the filter 1000 includes two separate electrodes, namely, IDT electrode 104 and IDT electrode 105, connected in series in the piezoelectric substrate 100. A terminal 110 connected to the IDT electrode 104 and a terminal 111 connected to the IDT electrode 105 serve as balanced signal terminals. The IDT 101 and the IDT 103 are connected in parallel, and are then connected to an unbalanced signal terminal 113. Other terminals 112 of the IDTs 101 and 103 are grounded.

The surface acoustic wave filter 1000 functions as a filter regardless of whether a serial junction 114 connecting the IDT electrode 104 and the IDT electrode 105 in series is grounded or left as a floating electrode isolated from surrounding elements. The serial junction 114 set to be a floating electrode remains at an intermediate potential between the balanced signals occurring at the terminals 110 and 111 during the operation of the surface acoustic wave filter 1000. The serial junction 114 is substantially at a ground potential. The outermost electrodes 115 and 116 of the IDT 102 are electrodes belonging to the serial junction 114. An electrode finger 117 of the IDT 101 adjacent to the IDT 102 is a signal electrode finger remaining connected to the unbalanced signal terminal 113. An electrode finger 118 of the IDT 103 adjacent to the IDT 102 is a ground electrode finger.

The surface acoustic wave filter having the balun transformation function for use in the RF stage of the mobile telephone preferably achieves an insertion loss as small as possible to a signal in the passband thereof. This is because the signal loss in the RF stage requires more power to increase in amplifier gain in a subsequent stage, and leads to a reduction in an S/N ratio (signal to noise ratio) of the RF stage that significantly effects communication quality.

The degree of balance of balanced signals generated in the surface acoustic wave filter having the balun transformation function for use in the RF stage of the mobile telephone is preferably good. The balanced signal, generated in the surface acoustic wave filter having the balun transformation function for use in the RF stage of the mobile telephone, is input to a differential amplifier at a subsequent stage. If the degree of balance of the balanced signal input to the differential amplifier is poor, the differential amplifier has insufficient performance.

The degree of balance of the balanced signals is a measure indicating how accurately the balanced signals have the same amplitude but opposite phases, and is expressed by an amplitude balance and a phase balance. The amplitude balance is an amplitude ratio of the two balanced signal, and is ideally zero [dB]. The phase balance is determined by subtracting 180° from a phase difference between the two balanced signals, and is ideally zero.

A small insertion loss and a high degree of balanced signals are required of the surface acoustic wave filter having the balun transformation function for use in the RF stage of the mobile telephone. The construction of the surface acoustic wave filter 1000 shown in FIG. 9 increases insertion loss in the passband and degrades the degree of balance of the balanced signals. Such construction will be discussed below.

When the unbalanced signal is applied to the unbalanced signal terminal 113, surface acoustic waves are excited inside the IDT 101 and the IDT 103. As a result, standing waves of the surface acoustic waves are generated in the area of the IDT 101, the IDT 102, and the IDT 103 interposed between the reflector 106 and the reflector 107, both reflecting the surface acoustic waves. The IDT electrode 104 and the IDT electrode 105 in the IDT 102 respectively convert the energy of the standing waves of the surface acoustic waves into electrical energy, thereby generating balanced signals. This is the principle of the operation of the surface acoustic wave filter 1000. What excites the surface acoustic waves is not limited to the inside of the IDT 101 and the inside of the IDT 103 when the unbalanced signal is applied to the unbalanced signal terminal 113. A surface acoustic wave is excited between the electrode finger 117 and the electrode finger 115, between which a voltage is applied, at the border between the IDT 101 and the IDT 102. On the other hand, very little (or no) surface acoustic wave is generated between the electrode finger 118 and the electrode finger 116 at the border between the IDT 103 and the IDT 102. In other words, when the unbalanced signal is applied to the unbalanced signal terminal 113, the excitation of the surface acoustic waves takes place in a bilaterally asymmetrical fashion in the surface acoustic wave filter 1000. Here, the symmetry is with respect to the IDT 102 with the IDT 101 on the left-hand side, and the IDT 103 on the right-hand side.

The bilateral asymmetrical excitation of the surface acoustic waves causes the standing waves of the surface acoustic waves to be asymmetrical, leading to an asymmetry in the distribution of currents flowing in the electrode fingers of the surface acoustic wave filter 1000. In other words, the bilaterally asymmetrical excitation of the surface acoustic waves causes the distribution of currents to be localized in a right half or a left half of the surface acoustic wave filter 1000. The localization of currents in the electrode fingers in a particular area increases energy loss in the form of heat through the resistance of the electrode fingers. The insertion loss of the surface acoustic wave filter 1000 is thus increased.

When the serial junction 114 is grounded, the bilateral asymmetry in the standing wave resulting from the bilateral asymmetrical excitation of the surface acoustic waves becomes a dominant factor which degrades the degree of balance in the balanced signals generated in the surface acoustic wave filter 1000. When the serial junction 114 is grounded, electromotive forces in the IDT electrode 104 and the IDT electrode 105 produce the voltages at the balanced signal terminals. The degree of balance of the electromotive forces of the IDT electrode 104 and the IDT electrode 105 is a dominant factor which determines the degree of balance of the balanced signals. The bilaterally asymmetrical standing waves directly deteriorate the degree of balance of the electromotive forces of the IDT electrode 104 and the IDT electrode 105. Thus, the degree of balance of the balanced signals of the surface acoustic wave filter 1000 is degraded.

The bilateral asymmetry of the excitation of the surface acoustic waves is caused because the surface acoustic waves are generated at the border between the IDT 101 and the IDT 102 while the surface acoustic waves are not generated at the border between the IDT 103 and the IDT 102. Such bilateral asymmetry increases the insertion loss of the surface acoustic wave filter 1000. The degree of balance of the balanced signals is degraded when the serial junction 114 is grounded.

Achieving perfect symmetry in the distribution of the surface acoustic wave excitation is impossible in principle in the structure of the 3-IDT longitudinally coupled resonator type filter in which right and left IDTs are connected in parallel to pick up an unbalanced signal and balanced signals are picked up from the center IDT having two separate electrodes arranged in the direction of propagation of the surface acoustic wave.

SUMMARY OF THE INVENTION

To overcome the problems described above, preferred embodiments of the present invention provide a surface acoustic wave filter which improves the degree of balance of balanced signals and reduces insertion loss by reducing a bilateral asymmetry in the distribution of surface acoustic wave excitation, and provides a communication apparatus which includes the surface acoustic wave filter.

In a first preferred embodiment of the present invention, a surface acoustic wave filter includes a piezoelectric substrate, and a first reflector, a first IDT, a second IDT, a third IDT, and a second reflector, arranged on the piezoelectric substrate in that order in the direction of propagation of a surface acoustic wave. The first and third IDTs, connected in parallel to each other, are connected together to an unbalanced signal terminal. The second IDT includes two separate electrodes arranged in the direction of propagation of the surface acoustic wave, electrically connected in series with each other at a serial junction, and respectively connected to balanced signal terminals. The outermost electrode fingers of the second IDT adjacent to the first IDT and the third IDT are connected to the serial junction. The outermost electrode finger of the first IDT adjacent to the second IDT is connected to the unbalanced signal terminal. The outermost electrode finger of the third IDT adjacent to the second IDT is grounded. The first IDT or both the first IDT and the third IDT are weighted such that the number of exciting regions of the surface acoustic wave in the first IDT adjacent to the second IDT is equal to the number of exciting regions in the third IDT adjacent to the second IDT.

In the above-described arrangement, the bilateral asymmetry in the surface acoustic wave excitation is reduced, resulting in a reduction in insertion loss and an improvement in the degree of balance of balanced signals.

In a second preferred embodiment of the present invention, a surface acoustic wave filter includes a piezoelectric substrate, and a first reflector, a first IDT, a second IDT, a third IDT, and a second reflector, arranged on the piezoelectric substrate in that order in the direction of propagation of a surface acoustic wave. The first and third IDTs, connected in parallel to each other, are connected together to an unbalanced signal terminal. The second IDT includes two separate electrodes arranged in the direction of propagation of the surface acoustic wave, electrically connected in series with each other at a serial junction, and respectively connected to balanced signal terminals. The outermost electrode fingers of the second IDT adjacent to the first IDT and the third IDT are connected to the serial junction. The outermost electrode finger of the first IDT adjacent to the second IDT is connected to the unbalanced signal terminal. The outermost electrode finger of the third IDT adjacent to the second IDT is grounded. The first IDT is serial connection weighted.

The serial connection weighting is performed as described below. Two adjacent electrode fingers are shortened to approximately half the length of the remaining electrode fingers, two dummy electrode fingers are arranged in a blank area which is made as a result of halving the two electrodes in length, and the two dummy electrode fingers are electrically connected to each other.

In the above-described arrangement, the bilateral asymmetry in the surface acoustic wave excitation is reduced, resulting in a reduction in insertion loss and improvements in the degree of balance of balanced signals.

Preferably, the first through fifth electrode fingers of the first IDT closest to the second IDT are serial connection weighted.

In the above-described arrangement, the weighted electrode fingers of the first IDT closest to the second IDT reduce the bilateral asymmetry of the surface acoustic wave, leading to a reduction in insertion loss and an improvement in the degree of balance of the balanced signals.

In a third preferred embodiment of the present invention, a surface acoustic wave filter includes a piezoelectric substrate, and a first reflector, a first IDT, a second IDT, a third IDT, and a second reflector, arranged on the piezoelectric substrate in that order in the direction of propagation of a surface acoustic wave. The first and third IDTs, connected in parallel to each other, are connected together to an unbalanced signal terminal. The second IDT includes two separate electrodes arranged in the direction of propagation of the surface acoustic wave, electrically connected in series with each other at a serial junction, and respectively connected to balanced signal terminals. The outermost electrode fingers of the second IDT adjacent to the first IDT and the third IDT are connected to the serial junction. The outermost electrode finger of the first IDT adjacent to the second IDT is connected to the unbalanced signal terminal. The outermost electrode finger of the third IDT adjacent to the second IDT is grounded. The outermost electrode finger of the first IDT adjacent to the second IDT is apodization weighted.

Preferably, the outermost electrode finger of the first IDT adjacent to the second IDT is approximately half the length of the other electrode fingers of the first IDT to achieve apodization weighting, wherein the surface acoustic wave filter includes a dummy electrode finger that is arranged in an extension line extending from the end of the apodization weighted electrode finger, and the dummy electrode finger is provided in an area of an IDT electrode of the first IDT different from an IDT electrode of the first IDT having the apodization weighted electrode finger.

Preferably, the first and second outermost electrode fingers of the first IDT adjacent to the second IDT are approximately two-thirds the length of the other electrode fingers of the first IDT to achieve apodization weighting, wherein the surface acoustic wave filter includes a dummy electrode finger that is arranged in an extension line extending from the ends of the apodization weighted electrode fingers and wherein the dummy electrode finger is provided in an area of an IDT electrode of the first IDT different from an IDT electrode of the first IDT having the apodization weighted electrode finger.

In the above-described arrangement, the bilateral asymmetry in the surface acoustic wave excitation is reduced, resulting in a reduction in insertion loss and an improvement in the degree of balance of balanced signals.

In a fourth preferred embodiment of the present invention, a surface acoustic wave filter includes a piezoelectric substrate, and a first reflector, a first IDT, a second IDT, a third IDT, and a second reflector, arranged on the piezoelectric substrate in that order in the direction of propagation of a surface acoustic wave. The first and third IDTs, connected in parallel to each other, are connected together to an unbalanced signal terminal. The second IDT includes two separate electrodes arranged in the direction of propagation of the surface acoustic wave, electrically connected in series with each other at a serial junction, and respectively connected to balanced signal terminals. The outermost electrode fingers of the second IDT adjacent to the first IDT and the third IDT are connected to the serial junction. The first and second outermost electrode finger of the first IDT adjacent to the second IDT are grounded. The outermost electrode finger of the third IDT adjacent to the second IDT is grounded, an electrode finger of the third IDT, connected to one of the unbalanced signal terminals, closest to the second IDT is approximately half the length of the other electrode fingers of the third IDT to achieve apodization weighting. The surface acoustic wave filter further includes a dummy electrode finger that is arranged in an extension line extending from the end of the apodization weighted electrode finger, and the dummy electrode finger is provided in an area of an IDT electrode of the third IDT different from an IDT electrode of the third IDT having the apodization weighted electrode finger.

In the above-described arrangement, the bilateral asymmetry in the surface acoustic wave excitation is reduced, resulting in a reduction in insertion loss and an improvement in the degree of balance of balanced signals.

Preferably, the serial junction of the second IDT is grounded.

In the above-described arrangement, the output voltages of the two comb-like electrodes have greatly improved balance. The grounding of the serial junction produces the improved balance of the output voltages of the two comb-like electrodes which affects the degree of balance of the balanced signal terminals. Furthermore, with the serial junction joints grounded, electromagnetic shielding between the unbalanced terminal and the balanced terminals is reinforced. The direct-path wave from the unbalanced signal terminal to the balanced signal terminals is reduced. The grounding of the serial junction thus reliably improves the degree of balance of the balanced signals.

Preferably, the serial junction of the second IDT is grounded through an electrode finger of one of the first IDT and the third IDT.

If a line or an electrode pad is added to the piezoelectric substrate to ground the serial junction, a parasitic capacitance may increase which adversely affects the characteristics of the surface acoustic wave filter. Instead of using the line or the electrode pad, the serial junction is preferably grounded by establishing a connection between an electrode finger of the second IDT connected to the serial junction and a ground electrode of one of the first IDT and the third IDT, or by establishing a connection between the serial junction of the second IDT and the ground electrode finger of one of the first IDT and the third IDT and, or by establishing the above two connections at the same time. The above-described grounding method for grounding the serial junction is performed without adding a line or an electrode pad on the piezoelectric substrate. Since little or no increase in parasitic capacitance occurs with this method, the characteristics of the surface acoustic wave filter are not adversely effected.

In a fifth preferred embodiment of the present invention, a communication apparatus includes one of the above-described surface acoustic wave filters. The communication apparatus including the surface acoustic wave filter having an improved balance of the balanced signals and a small insertion loss in a passband greatly improves transmission characteristics.

Other features, elements, characteristics and advantages of the present invention will become more apparent from the following detailed description of preferred embodiments thereof with reference to the attached figures.

DETAILED DESCRIPTION OF PREFERRED EMBODIMENTS

First Preferred Embodiment

A first preferred embodiment of the present invention will now be described with reference to FIGS. 1 through 4.

Figure 1:
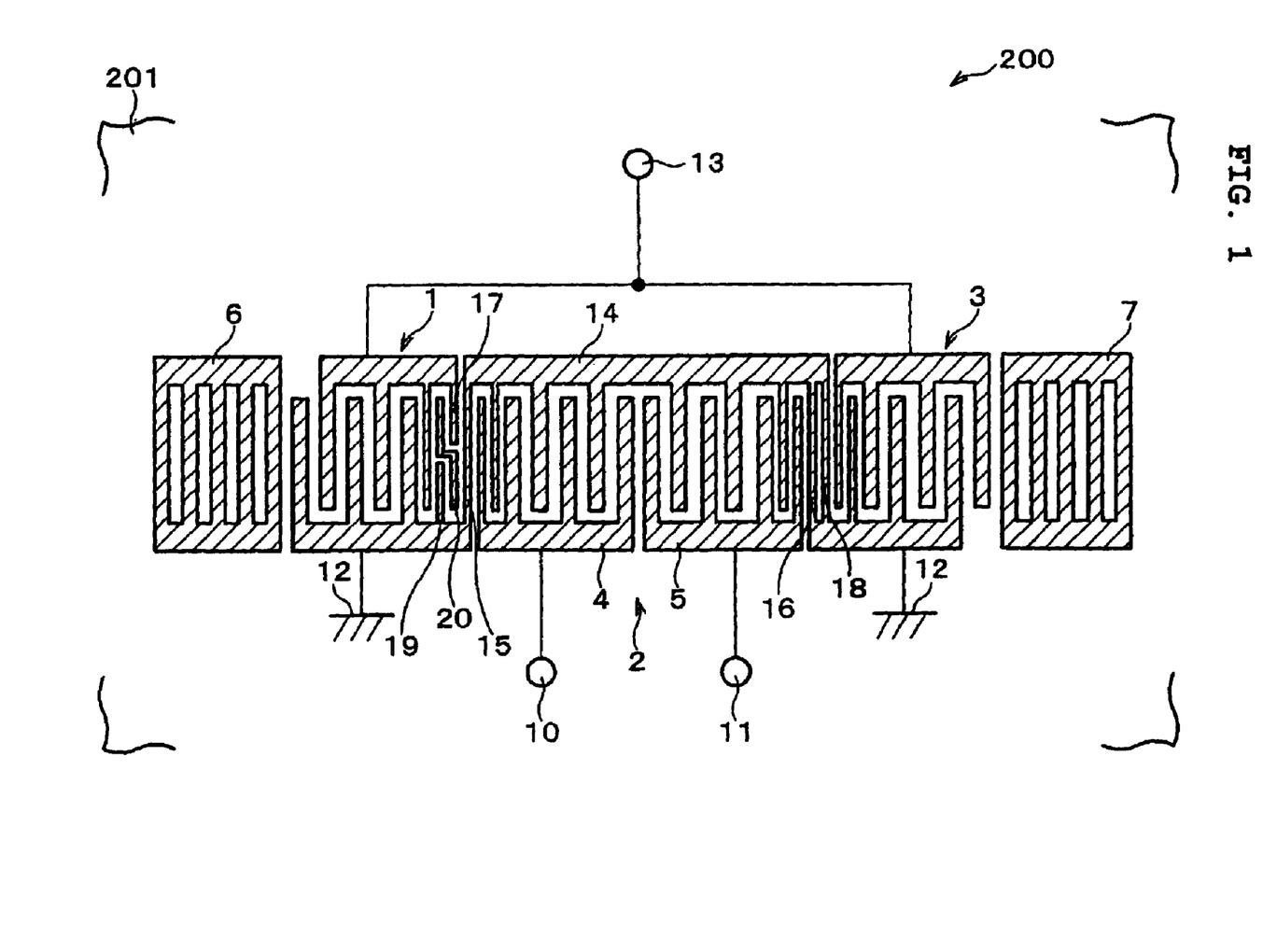
FIG. 1 illustrates the structure of a surface acoustic wave filter in accordance with a first preferred embodiment of the present invention.

FIG. 1 illustrates a surface acoustic wave filter 200 according to the first preferred embodiment of the present invention. The surface acoustic wave filter 200 preferably includes a reflector 6, an IDT (interdigital transducer) 1, an IDT 2, an IDT 3, and a reflector 7 arranged in that order on a piezoelectric substrate 201 in a direction of propagation of a surface acoustic wave. The IDT 2 and the IDT 3 are connected in parallel. Terminals 12 of ground electrodes of the IDT 1 and the IDT 3 are grounded. The other electrodes of the IDT 1 and the IDT 3 are connected to an unbalanced signal terminal 13.

The IDT 2 includes an IDT electrode 4 and an IDT electrode 5 arranged in the direction of propagation of a surface acoustic wave, and a serial junction 14 which is also an IDT electrode. The IDT electrode 4 and the IDT electrode 5 are electrically serially connected to each other through the serial junction 14. The terminal of the IDT electrode 4, not connected to the serial junction 14, defines a balanced signal terminal 10. The terminal of the IDT electrode 5, not connected to the serial junction 14, defines a balanced terminal 11. The IDT 2 includes the outermost electrode fingers 15 and 16, connected to the serial junction 14. In the first preferred embodiment, the electrode fingers 15 and 16 are connected to ground electrodes of the IDT 1 and the IDT 3, respectively. In the IDTs 1, 2, and 3, IDT electrode fingers respectively connected to the balanced signal terminals 10 and 11, and the unbalanced signal terminal 13 are referred to as signal electrode fingers, and IDT electrode fingers, which are grounded, are referred to as ground electrode fingers.

An electrode finger 17 of the IDT 1 adjacent to the IDT 2 is connected to the unbalanced signal terminal 13. An electrode finger 18 of the IDT 3 adjacent to the IDT 2 is grounded. Furthermore, the electrode finger 18 is connected to the serial junction 14 of the IDT 2. As a result, the serial junction 14 is grounded through the electrode fingers 15, 16, and 18. The electrode finger 17 of the IDT 1 is approximately half the length of other electrode fingers of the IDT 1. An electrode finger 19 of the IDT 1 next to the electrode finger 17 is approximately half the length of the other electrode fingers of the IDT 1. Dummy electrode fingers 20, electrically connected to each other, are arranged in an electrode finger non-existent area where the electrode fingers 17 and 19 are approximately half the length of the other electrode fingers. One electrode finger 20 is arranged in an extension line extending from the end of the electrode finger 17 and the other electrode finger 20 is arranged in an extension line extending from the end of the electrode finger 19. The dummy electrode fingers 20 are not connected to the interdigital electrodes of the IDTs, and are floating electrode fingers. The electrode fingers 17 and 19 are serial connection weighted. In this manner, the number of surface acoustic wave exciting regions in the IDT 1 is reduced by one. The number of surface acoustic wave exciting regions in the IDT 1 is equalized with the number of surface acoustic wave exciting regions in the IDT 3. The bilateral asymmetry in the surface acoustic wave in the surface acoustic wave filter 200 is reduced when an unbalanced signal is applied. The surface acoustic wave exciting region refers to a region where a surface acoustic wave is generated (excited). For example, a surface acoustic wave is generated between a signal electrode finger and a ground electrode finger when voltages are respectively applied to the signal electrode finger and the ground electrode finger. The magnitude of a surface acoustic wave generated between the dummy electrode finger 20 and an electrode finger adjacent thereto in a weighted region is approximately half the magnitude of a surface acoustic wave generated between standard electrode fingers. In accordance with the first preferred embodiment, the serial connection weighting sets the magnitude of the surface acoustic wave generated in a particular surface acoustic wave exciting region to be as approximately half the magnitude of the surface acoustic wave in other surface acoustic wave exciting regions. This arrangement greatly reduces the bilateral asymmetry in the surface acoustic wave in the surface acoustic wave filter 200.

A monocrystal substrate of 40±5° Y-axis cut lithium tantalate ($LiTaO_3$) is used as the piezoelectric substrate 201. The direction of propagation of a surface acoustic wave is set to be an X axis direction. The surface acoustic wave filter 200 is made of an aluminum thin-film pattern having a thickness of 206 nm provided on the piezoelectric substrate 201.

One example of detailed design parameters of the surface acoustic wave filter 200 is as follows: each of the reflectors 6 and 7 includes 200 grating lines of a pitch of 1.09 μm, and a metallization of 0.7. The IDT 1, the IDT 2 (the IDT electrode 4 and the IDT electrode 5), and the IDT 3 have 22 electrode fingers, 32 electrode fingers (16 electrode fingers and 16 electrode fingers), and 22 electrode fingers, respectively. Each of the IDT 1, the IDT 2, and the IDT 3 has a finger pitch of 1.08 μm and a metallization ratio of 0.7. Three electrode fingers of the IDT 1 closer to the IDT 2, three electrode fingers of the IDT 2 closer to the IDT 1, three electrode fingers of the IDT 2 closer to the IDT 3, and three electrode fingers of the IDT 3 closer to the IDT 2 are arranged at a finger pitch of 0.97 μm and a metallization ratio of 0.6. The distance between the reflector 6 and the IDT 1, and the distance between the reflector 7 and the IDT 3 are both 1.0 μm. The distance between the IDT 1 and the IDT electrode 4, and the distance between the IDT 3 and the IDT electrode 5 are both 0.97 μm. The distance between the IDT electrode 4 and the IDT electrode 5 is 1.08 μm.

Figure 2:
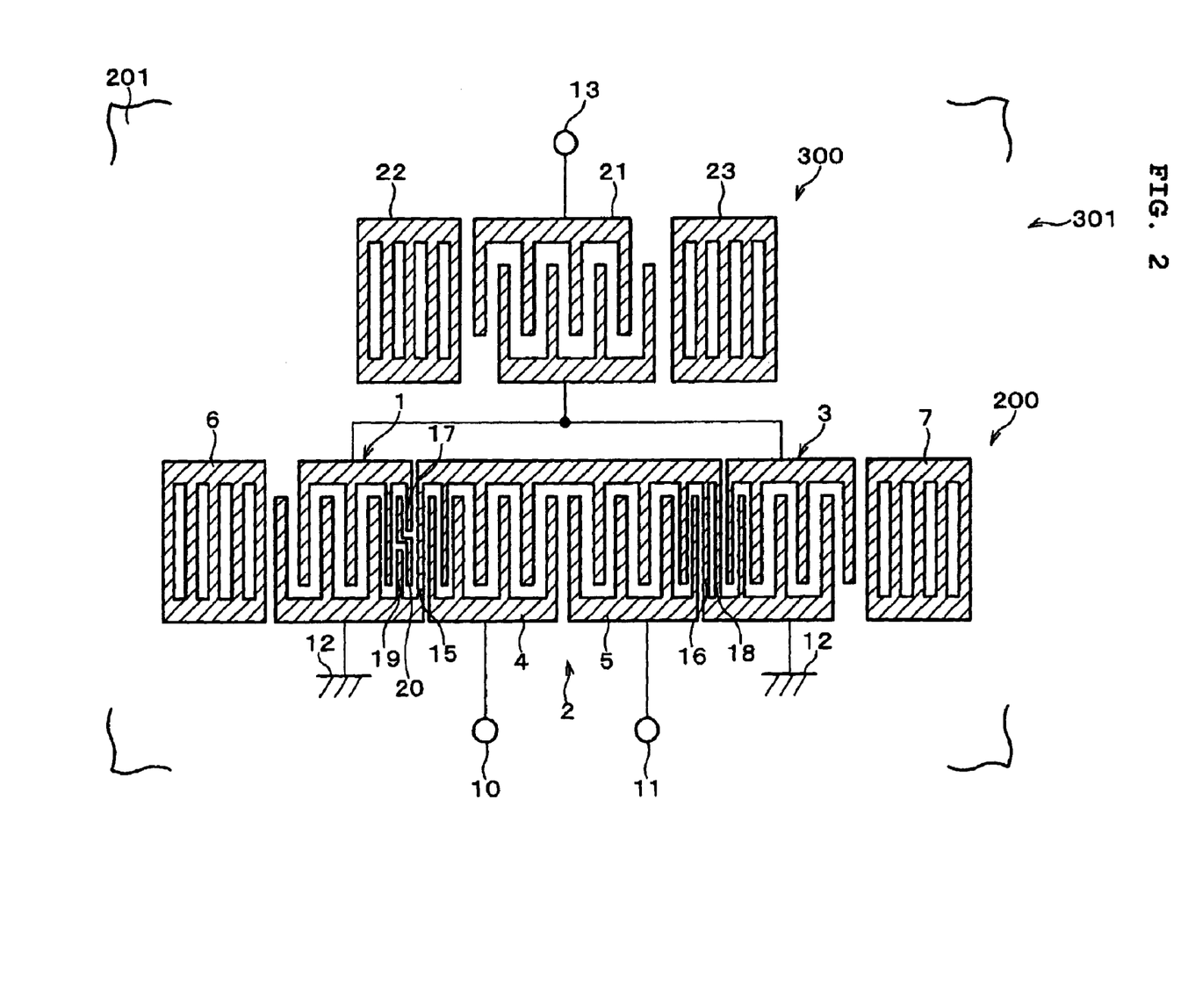
FIG. 2 illustrates a modification of the surface acoustic wave filter of FIG. 1.

A surface acoustic wave filter 301 including the surface acoustic wave filter 200 will now be discussed with reference to FIG. 2.

In the surface acoustic wave filter 301, a one-terminal pair surface acoustic wave resonator 300 is serially connected to the unbalanced signal terminal of the surface acoustic wave filter 200. More specifically, a parallel connection of the IDT 1 and the IDT 3 is connected to the unbalanced signal terminal 13 through the serially connected surface acoustic resonator 300. The surface acoustic wave filter with a one-terminal pair surface acoustic wave resonator connected to the unbalanced signal terminal thereof is typically used in 2 GHz band RF surface acoustic wave filters used in actual mobile telephones. FIG. 2 illustrates the structure of an RF surface acoustic wave filter typically used in actual mobile telephones.

As the surface acoustic wave filter 200 is arranged on the piezoelectric substrate 201, the surface acoustic resonator 300 is made of a pattern of aluminum thin film having a thickness of 206 nm, for example. The surface acoustic resonator 300 includes a reflector 22, an IDT 21, and a reflector 23 arranged on the piezoelectric substrate 201 in that order in a direction of propagation of a surface acoustic wave. The values of design parameters of the surface acoustic resonator 300 are as follows: each of the reflectors 22 and 23 includes 100 grating lines with a pitch of 1.05 $\mu$m and a metallization ratio of 0.7 and the IDT 21 has 150 electrode fingers with a pitch of 1.05 $\mu$m and a metallization ratio of 0.7. Each of the distance between the reflector 22 and the IDT 21, and the distance between the reflector 23 and the IDT 21 is 1.05 $\mu$m.

Figure 3A:
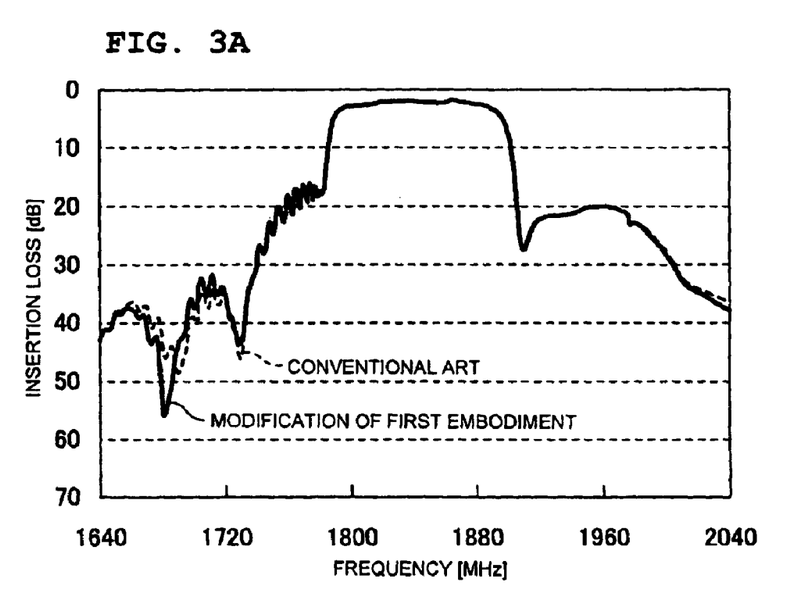
FIGS. 3A and 3B are graphs plotting signal transmission characteristics of the surface acoustic wave filter of FIG. 2 and a conventional surface acoustic wave filter.
Figure 3B:
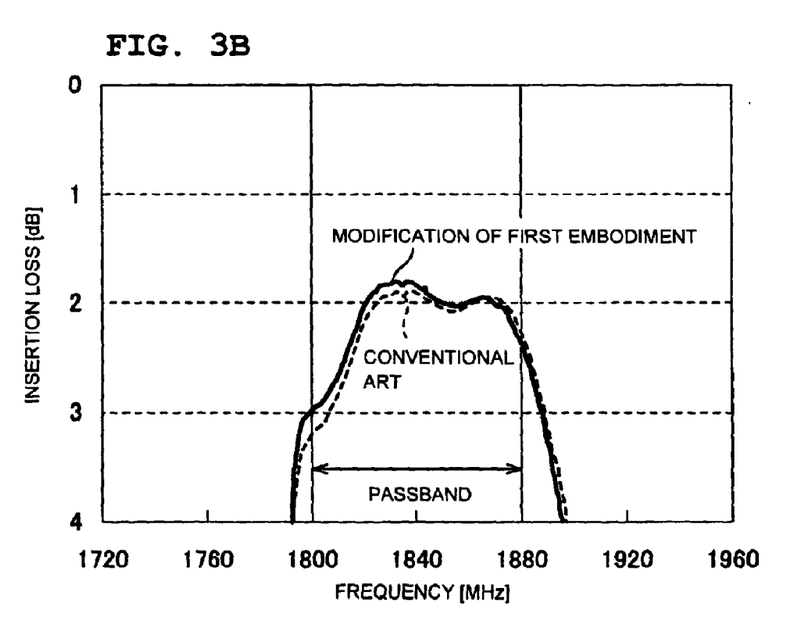

FIGS. 3A and 3B are graphs plotting signal transmission characteristics of the surface acoustic wave filter 301. A passband of the surface acoustic wave filter 301 ranges from 1800 MHz to 1880 MHz. As shown, the signal transmission characteristic of the surface acoustic wave filter 301 is represented by the solid line, while the signal transmission characteristic of a conventional surface acoustic wave filter is represented by the broken line. The conventional surface acoustic wave filter refers to the surface acoustic wave filter 301 with the IDT 1 having no serial connection weighting. As shown, the insertion loss of the surface acoustic wave filter 301 is less than that of the conventional surface acoustic wave filter particularly in a low frequency region of the passband. The insertion loss characteristic is thus greatly improved in the surface acoustic wave filter of the modification of the first preferred embodiment.

Figure 4:
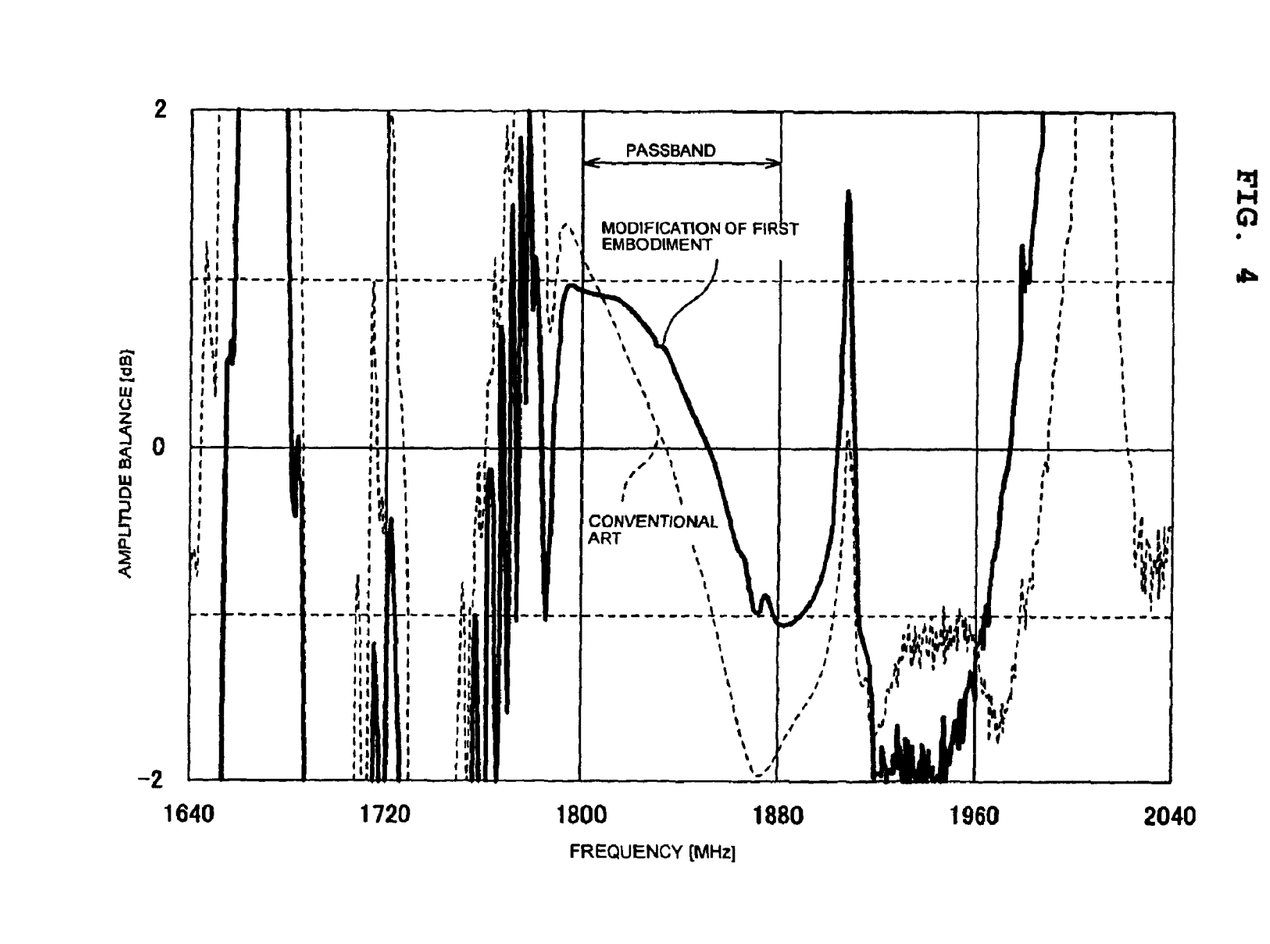
FIG. 4 is a graph plotting amplitude balances of the surface acoustic wave filter of FIG. 2 and the conventional surface acoustic wave filter.

FIG. 4 is a graph plotting an amplitude balance of the balanced signals of the surface acoustic wave filter 301. As shown, the amplitude balance of the surface acoustic wave filter 301 is represented by the solid line, while the amplitude balance of the conventional surface acoustic wave filter is represented by the broken line. The conventional surface acoustic wave filter refers to the surface acoustic wave filter 301 with the IDT 1 having no serial connection weighting. As shown, the amplitude balance of the conventional surface acoustic wave filter ranges from about −2.0 dB to about +1.1 dB while the amplitude balance of the surface acoustic wave filter 301 ranges from about −1.0 dB to about +1.0 dB. The surface acoustic wave filter 301 achieves a substantial improvement in the amplitude balance as compared to the conventional surface acoustic wave filter.

Figure 5:
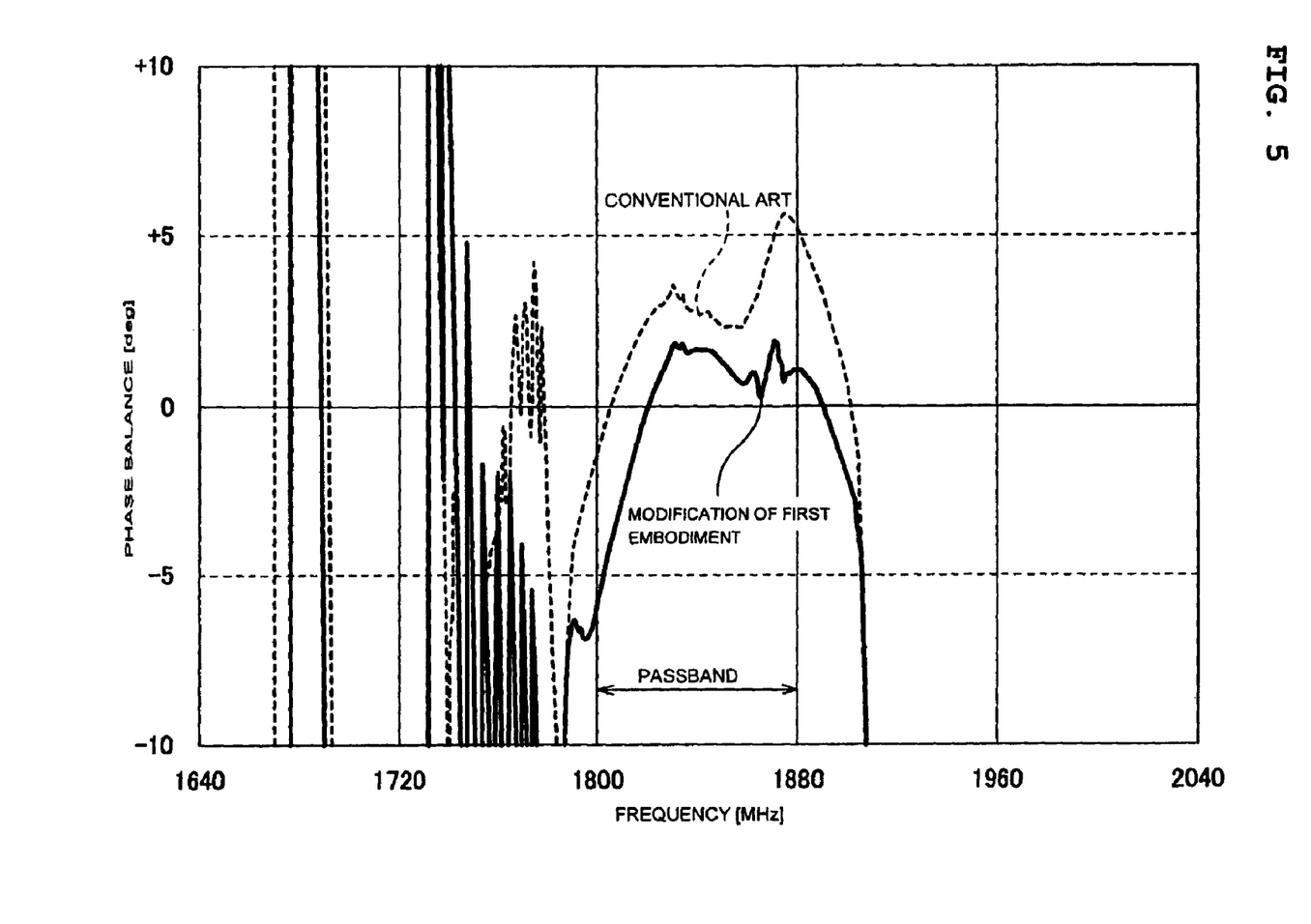
FIG. 5 is a graph plotting phase balances of the surface acoustic wave filter of FIG. 2 and the conventional surface acoustic wave filter.

FIG. 5 is a graph plotting a phase balance of the surface acoustic wave filter 301. As shown, the phase balance of the surface acoustic wave filter 301 is represented by the solid line while the phase balance of the conventional surface acoustic wave filter is represented by the broken line. The conventional surface acoustic wave filter corresponds to the surface acoustic wave filter 301 with the IDT 1 having no serial connection weighting. It is difficult to determine which of the surface acoustic wave filter 301 and the conventional surface acoustic wave filter outperforms the other in terms of the phase balance. However, if the amplitude balances plotted in FIG. 4 are also considered together, it is obvious that the surface acoustic wave filter 301 provides improvements in the phase balance over the conventional surface acoustic wave filter.

Second Preferred Embodiment

A second preferred embodiment of the present invention will now be described with reference to FIG. 6. For convenience of explanation, elements that are identical to those described with reference to the first preferred embodiment are designated with the same reference numerals and the discussion thereof is omitted.

Figure 6:
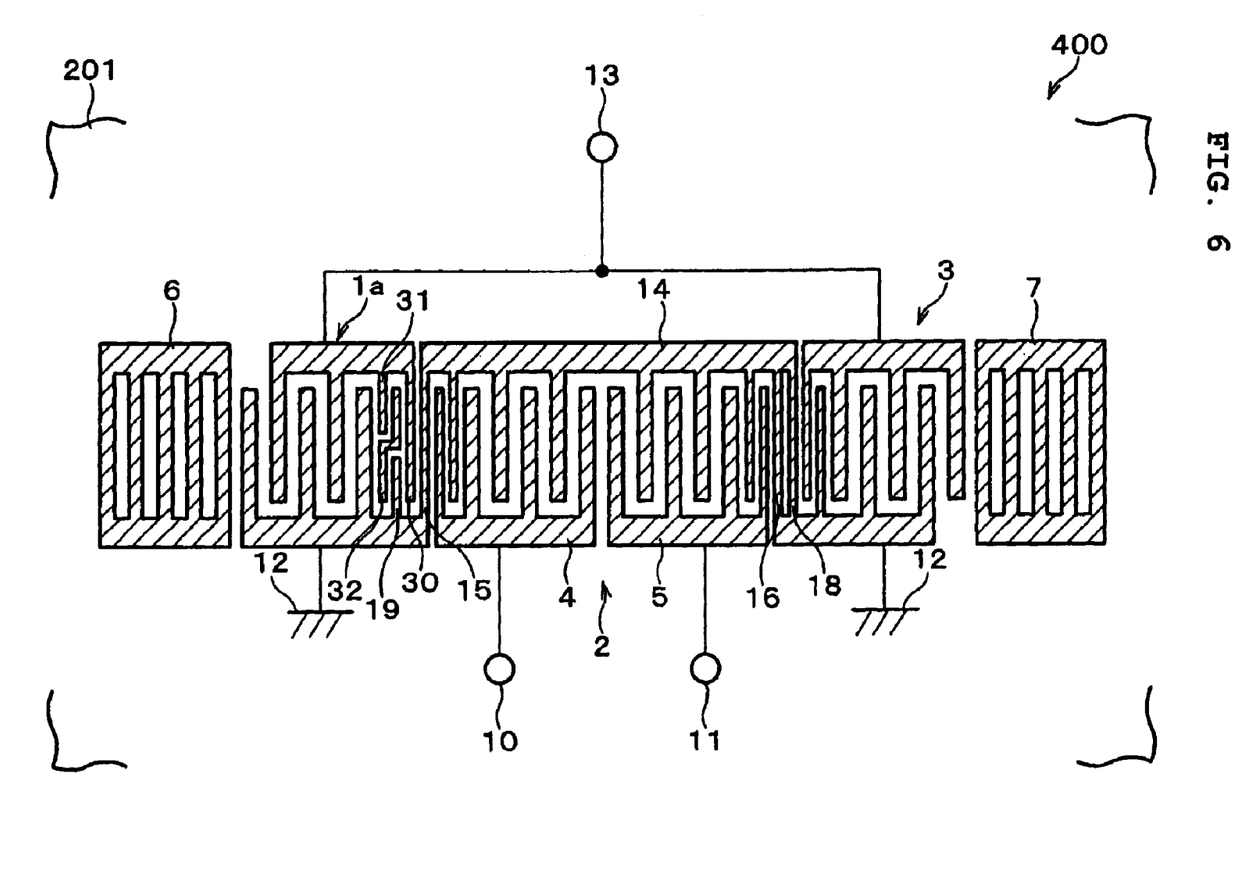
FIG. 6 illustrates the structure of a surface acoustic wave filter in accordance with a second preferred embodiment of the present invention.

FIG. 6 illustrates a surface acoustic wave filter 400 of the second preferred embodiment. The surface acoustic wave filter 400 includes an IDT 1a instead of the IDT 1 used in the piezoelectric substrate 201 in the first preferred embodiment. The IDT 1a has a serial connection weighting between a second electrode finger and a third electrode finger from the IDT 2 rather than between the first and second electrode fingers in the IDT 1. A first electrode finger 30 closest to the IDT 2 has substantially the same length as the remaining electrode fingers. A third electrode finger 31 closest to the IDT 2 is approximately half the length of the remaining electrode fingers. The electrode fingers 19 and 31, being approximately half the length of the other electrode fingers, cause an electrode finger non-existent area that is then filled with two electrically connected dummy electrode fingers 32. The dummy electrode fingers 32 are arranged in extension lines extending from the ends of the electrode fingers 19 and 31. The electrode fingers 19 and 31 are thus serial connection weighted.

The surface acoustic wave filter 400 of the second preferred embodiment of the present invention provides slightly less advantage in terms of the reduction of insertion loss and improvement of the degree of balance of the balanced signals than the surface acoustic wave filter 301 of the first preferred embodiment of the present invention. However, the surface acoustic wave filter 400 provides improvements in input and output impedance matching characteristics, which are important in the surface acoustic wave filter, over the surface acoustic wave filter 301. More specifically, the surface acoustic wave filter 400 outperforms the conventional surface acoustic wave filters in the input and output impedance matching characteristics.

Third Preferred Embodiment

A third preferred embodiment of the present invention will now be described with reference to FIG. 7. For convenience of explanation, elements that are identical to those discussed in connection with the first and second preferred embodiments are designated with the same reference numerals and the discussion thereof is omitted.

Figure 7:
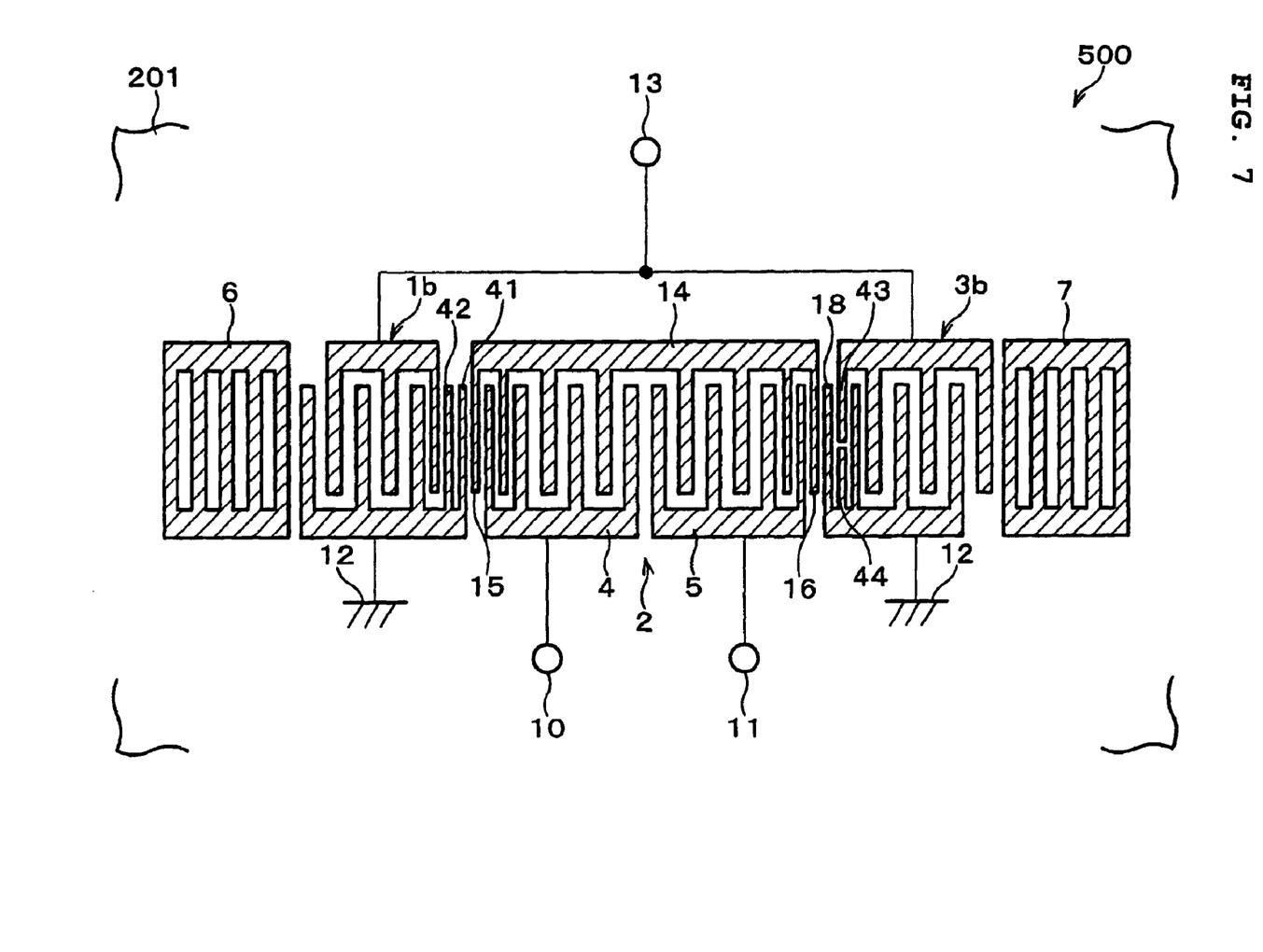
FIG. 7 illustrates the structure of a surface acoustic wave filter in accordance with a third preferred embodiment of the present invention.

FIG. 7 illustrates a surface acoustic wave filter 500 in accordance with the third preferred embodiment of the present invention. The surface acoustic wave filter 500 includes an IDT 1b instead of the IDT 1a used in the piezoelectric substrate 201 in the first preferred embodiment. The IDT 1b is identical to the IDT 1a except that the electrode finger thereof closest to the IDT 2 is eliminated. The number of surface acoustic wave exciting regions of IDT 1b is less than that of the IDT 1 by two. Furthermore, the IDT 3 is replaced with an IDT 3b having one electrode finger that is approximately half the length of the other electrode fingers.

Since the IDT 1b has no signal electrode finger closest to the IDT 2, two electrode fingers 41 and 42 of the IDT 1b closest to the IDT 2 are grounded. The electrode fingers 41 and 42 are the outermost electrode finger and second outermost electrode finger adjacent to the IDT 2. An electrode finger 15 of the IDT 2 is not connected to the ground electrode fingers of the IDT 1b. A signal electrode finger 43 and a ground electrode finger 44, adjacent to an electrode finger 18 of the IDT 3b, are approximately half the length of the remaining electrode fingers.

The electrode finger 18 of the IDT 3b, adjacent to the IDT 2, is not connected with the serial junction 14. An electrode finger 16 of the IDT 2 is not connected to the electrode of the IDT 3b. In other words, the serial junction 14 is a floating electrode isolated from the surrounding elements.

If the number of electrode fingers of the IDT 1b is identical to that of the IDT 1a, the number of surface acoustic wave exciting regions is increased by one, while the number of surface acoustic wave exciting regions between the IDT 2 and the IDT 3b remains unchanged. Thus, a bilateral asymmetry is caused. With one signal electrode finger in the IDT 1a eliminated in the IDT 1b, no additional surface acoustic wave exciting region is generated between the IDT 2 and the IDT 1b and the arrangement of the ground electrode fingers 41 and 42 reduces the number of surface acoustic wave exciting regions. More specifically, the number of surface acoustic wave exciting regions is reduced by two on the left-hand portion thereof. Since the IDT 3b has the one signal electrode finger approximately half the length of the other electrode fingers, the number of surface acoustic wave exciting regions on the right-hand portion is reduced by one. In other words, a bilateral symmetry in the number of surface acoustic wave exciting regions between the left-hand and right-hand portions of the surface acoustic wave filter 500 is assured. The degree of balance is thus improved.

The surface acoustic wave filter includes a first reflector, a first IDT, a second IDT, a third IDT, and a second reflector arranged in that order on a piezoelectric substrate in a direction of propagation of a surface acoustic wave (from right to left). The second IDT in the center includes two separate electrodes which are connected to each other at a serial junction. The two electrodes are respectively connected to unbalanced signal terminals. The first IDT and the third IDT are connected in parallel and also connected together to the unbalanced signal terminal. The comb-like electrodes of the first IDT and the third IDT, not connected to the unbalanced signal terminal, are grounded. The number of surface acoustic wave exciting regions on the left-hand portion and the number of surface acoustic wave exciting regions on the right-hand portion of the filter are equal to each other.

If the surface acoustic wave exciting regions are provided between the mutually adjacent electrode fingers of the first IDT and the second IDT, and if no surface acoustic wave exciting regions are provided between the mutually adjacent electrode fingers of the second IDT and the third IDT, the electrode fingers of the third IDT are weighted such that the number of surface acoustic wave exciting regions in the third IDT is reduced by n (n is an integer equal to or larger than 1). In the first IDT, the electrode fingers are weighted, thereby reducing the number of surface acoustic wave exciting regions by (n+1).

If there is a difference in the number of surface acoustic wave exciting regions between the left-hand portion and the right-hand portion, the surface acoustic waves are excited bilaterally asymmetrically when an unbalanced signal is applied to the surface acoustic wave filter. This increases the insertion loss and degrades the balance of the balanced signals.

Since the surface acoustic wave exciting regions on the left-hand portion and the right-hand portion are equal to each other in the surface acoustic wave filter of the third preferred embodiment, the bilateral asymmetry in the surface acoustic wave excitation is reduced. This arrangement greatly reduces the insertion loss, and improves the degree of balance of the balanced signals. However, excessive weighting adversely affects the characteristics of the longitudinally coupled resonator type surface acoustic wave filter. Preferably, only the electrode fingers of the first IDT are weighted rather than weighting the electrode fingers of the third IDT that reduces the number of surface acoustic wave exciting regions. More specifically, with n=0, the number of surface acoustic wave exciting regions is preferably reduced by one in the first IDT.

A weighting method that may be used to reduce the number of surface acoustic wave exciting regions by one, is an apodization weighting method in which the length of one of the signal electrode fingers in the first IDT is shortened to a length approximately half the length of the other signal electrode fingers. Another weighting method that may be used is a serial connection weighting method in which one signal electrode finger and a ground electrode finger adjacent to the one signal electrode finger in the first IDT have a length approximately half the length of the remaining electrode fingers, and two dummy electrode fingers are arranged in two electrode finger non-existent areas which are created by halving the signal electrode and the ground electrode in length. The two dummy electrode fingers are electrically connected to each other. The dummy electrode fingers are arranged in extension lines extending from the ends of the two electrode fingers having the length approximately half the length of the remaining electrode fingers. Yet another weighting method that may be used is a method in which two signal electrode fingers are shortened in length by one-quarter of the length of the remaining electrode fingers. In other words, the length of the two signal electrode fingers in the first IDT are three-quarters of the length of the remaining electrode fingers.

The position of the weighting is not limited to any particular location. Since the purpose of the weighting is to correct the surface acoustic wave in the border between the first IDT and the second IDT, the weighting the electrode fingers of the first IDT closer the second IDT is effective to reduce the bilateral asymmetry of the surface acoustic wave. For example, the first through fifth electrode fingers of the first IDT closest to the second IDT are preferably weighted. More preferably, the electrode fingers of the first IDT adjacent to the second IDT are weighted.

Depending on design parameters of each IDT, the closer the electrode finger of the first IDT are to the second IDT, the larger the frequency characteristic of the input and output impedance of the surface acoustic wave filter in the passband. It is more difficult to match the input and output impedance of the surface acoustic wave filter to a rated impedance within the entire frequency range of the passband. In such a case, overall characteristics are optimized by separating the weighted electrode finger of the first IDT from the second IDT.

Whether or not the serial junction of the second IDT to ground is important. If the bilateral asymmetry in the surface acoustic wave excitation in the surface acoustic wave filter of the second preferred embodiment of the present invention is reduced, the symmetry of the standing waves of the surface acoustic waves is improved, and the degree of balance of the electromotive forces of the two separate IDT electrodes of the second IDT is greatly improved. The serial junction is preferably grounded such that the degree of balance of the electromotive forces of the two separate IDT electrodes is directly accounted for in the balance of the balanced signals.

Regardless of whether or not the present invention is implemented, electromagnetic shielding is reinforced between the unbalanced signal terminal and the balanced signal terminals when the serial junction is grounded. The direct-path wave from the unbalanced signal terminal to the balanced signal terminals is reduced. The grounding of the serial junction thus reliably improves the degree of balance of the balanced signal terminal. On the other hand, because the balance of the electromotive forces in the two separate IDT electrodes with the serial junction grounded directly determines the degree of balance of the balanced signal, a poor balance of the electromotive forces on the two separate IDT electrodes degrades the degree of balance of the balanced signal when the serial junction is grounded. Because of the improved balance of the two separate IDT electrodes in the preferred embodiments of the present invention, the grounding of the serial junction allows the balance of the two separate IDT electrodes to be directly accounted for in the degree of balance of the balanced signals. At the same, the direct-path wave from the unbalanced signal terminal to the balanced signal terminals is reduced. The grounding of the serial junction thus reliably improves the degree of balance of the balanced signal terminal.

If a line or an electrode pad is added to the piezoelectric substrate to ground the serial junction, a parasitic capacitance increases to adversely affect the characteristics of the surface acoustic wave filter. Instead of using the line or the electrode pad, the serial junction is grounded by establishing a connection between an electrode finger of the second IDT connected to the serial junction and a ground electrode of one of the first IDT and the third IDT, or by establishing a connection between the serial junction of the second IDT and the ground electrode finger of one of the first IDT and the third IDT and, or by establishing the above two connections at the same time. The above-described grounding method for grounding the serial junction is performed without adding a line or an electrode pad on the piezoelectric substrate. Thus, the above-described grounding method is particularly preferable.

A communication apparatus 600 including one of the above-described surface acoustic wave filters according to preferred embodiments of the present invention will now be discussed with reference to FIG. 8. The communication apparatus 600 includes in a receiver (RX side) an antenna 601, an antenna common part/RF top filter 602, an amplifier 603, an RF interstage filter 604, a mixer 605, a first IF filter 606, a mixer 607, a second IF filter 608, a first and second local synthesizer 611, a temperature-compensated crystal oscillator (TCXO) 612, a divider 613, and a local filter 614.

Figure 8:
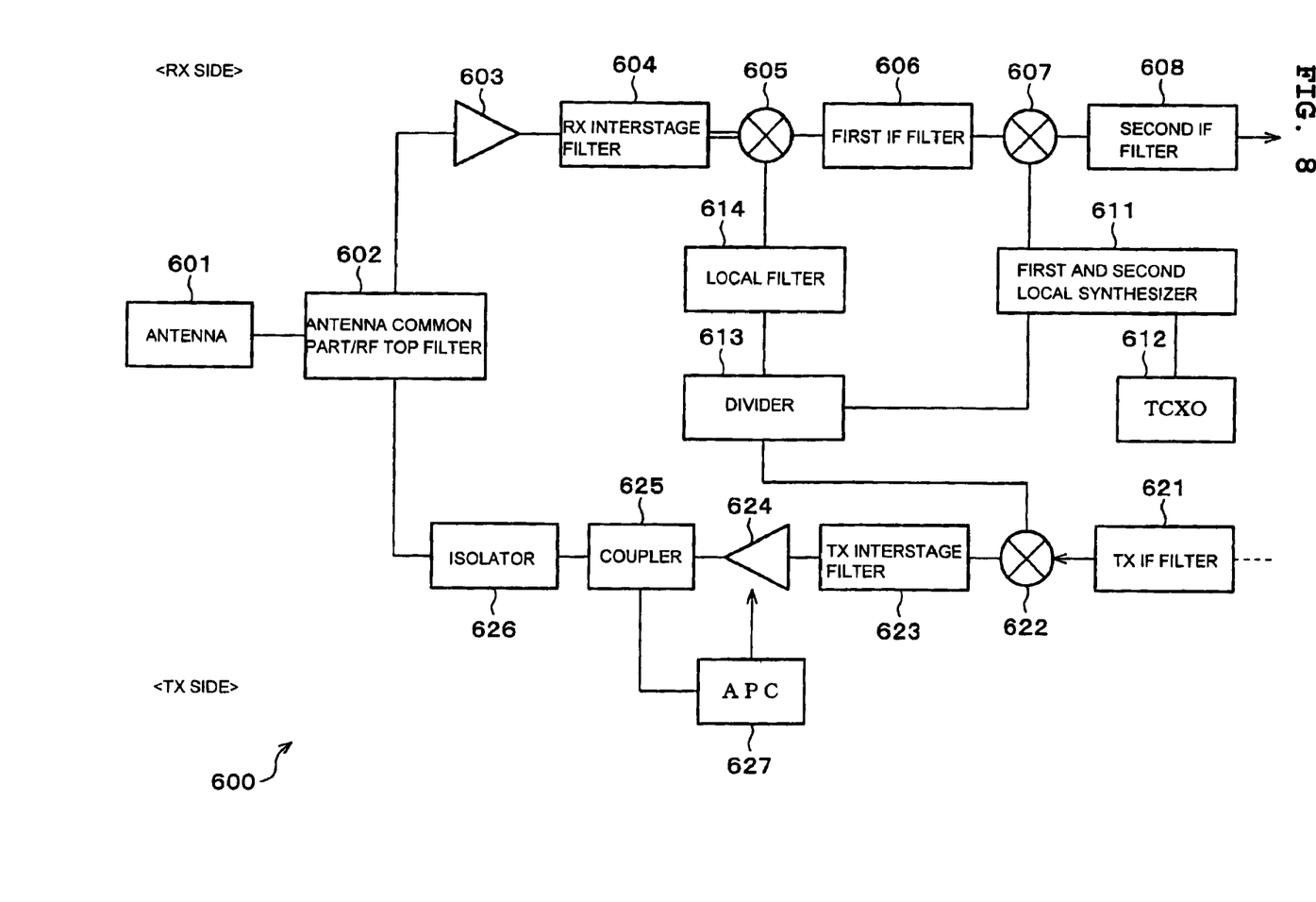
FIG. 8 is a block diagram showing major blocks of a communication apparatus of a preferred embodiment of the present invention.

Balanced signals are preferably transferred from the RF interstage filter 604 to the mixer 605 to assure signal balance using two lines as shown in FIG. 8.

In the communication apparatus 600, a transmitter (TX side) for transmitting a signal shares the antenna 601 and the antenna common part/RF top filter 602 with the RX side. The communication apparatus 600 includes in the TX side a TX IF filter 621, a mixer 622, a TX interstage filter 623, an amplifier 624, a coupler 625, an isolator 626, and an automatic power control (APC) 627.

One of the surface acoustic wave filters of the preceding preferred embodiments of the present invention is used for each of the RF interstage filter 604, the first IF filter 606, the TX IF filter 621, and the TX interstage filter 623.

The surface acoustic wave filter of preferred embodiments of the present invention provides improvements in the balance of the balanced signals and the insertion loss within the passband over the conventional surface acoustic wave filter. The communication apparatus including the surface acoustic wave filter of preferred embodiments of the present invention thus provides greatly improved transmission characteristics.

The advantages of the present invention are equally achieved in a surface acoustic wave filter which is produced by connecting, in parallel or in series, a one-terminal pair surface acoustic wave resonator to the balanced signal terminal or the unbalanced signal terminal of the surface acoustic wave filter of the preferred embodiments of the present invention or in a surface acoustic wave filter which is produced by connecting a plurality of surface acoustic wave filters of the preferred embodiments of the present invention. These arrangements also fall within the scope of the present invention.

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

What is claimed is:

1. A surface acoustic wave filter comprising a piezoelectric substrate, and a first reflector, a first IDT, a second IDT, a third IDT, and a second reflector, arranged on the piezoelectric substrate in that order in the direction of propagation of a surface acoustic wave, wherein the first and third IDTs, connected in parallel to each other, are connected to an unbalanced signal terminal, and the second IDT includes two separate electrodes arranged in the direction of propagation of the surface acoustic wave, electrically connected in series with each other at a serial junction, and respectively connected to balanced signal terminals; wherein the outermost electrode fingers of the second IDT adjacent to the first IDT and the third IDT are connected to the serial junction;

the outermost electrode finger of the first IDT adjacent to the second IDT is connected to the unbalanced signal terminal;

the outermost electrode finger of the third IDT adjacent to the second IDT is grounded; and the first IDT only or both the first IDT and the third IDT are weighted so that the number of exciting regions of the surface acoustic wave in the first IDT adjacent to the second IDT is equal to the number of exciting regions in the third IDT adjacent to the second IDT.

2. A surface acoustic wave filter according to claim 1, wherein the serial junction of the second IDT is grounded.

3. A surface acoustic wave filter according to claim 1, wherein the serial junction of the second IDT is grounded through an electrode finger of one of the first IDT and the third IDT.

4. A communication apparatus comprising a surface acoustic wave filter according to claim 1.

5. A surface acoustic wave filter comprising a piezoelectric substrate, and a first reflector, a first IDT, a second IDT, a third IDT, and a second reflector, arranged on the piezoelectric substrate in that order in the direction of propagation of a surface acoustic wave, wherein the first and third IDTs, connected in parallel to each other, are connected together to an unbalanced signal terminal, and the second IDT includes two separate electrodes arranged in the direction of propagation of the surface acoustic wave, electrically connected in series with each other at a serial junction, and respectively connected to balanced signal terminals; wherein the outermost electrode fingers of the second IDT adjacent to the first IDT and the third IDT are connected to the serial junction;

the outermost electrode finger of the first IDT adjacent to the second IDT is connected to the unbalanced signal terminal;

the outermost electrode finger of the third IDT adjacent to the second IDT is grounded; and the first IDT is serial connection weighted.

6. A surface acoustic wave filter according to claim 5, wherein the first through fifth electrode fingers of the first IDT closest to the second IDT are serial connection weighted.

7. A surface acoustic wave filter according to claim 5, wherein the serial junction of the second IDT is grounded.

8. A surface acoustic wave filter according to claim 5, wherein the serial junction of the second IDT is grounded through an electrode finger of one of the first IDT and the third IDT.

9. A communication apparatus comprising a surface acoustic wave filter according to claim 5.

10. A surface acoustic wave filter comprising a piezoelectric substrate, and a first reflector, a first IDT, a second IDT, a third IDT, and a second reflector, arranged on the piezoelectric substrate in that order in the direction of propagation of a surface acoustic wave, wherein the first and third IDTs, connected in parallel to each other, are connected together to an unbalanced signal terminal, and the second IDT includes two separate electrodes arranged in the direction of propagation of the surface acoustic wave, electrically connected in series with each other at a serial junction, and respectively connected to balanced signal terminals; wherein the outermost electrode fingers of the second IDT adjacent to the first IDT and the third IDT are connected to the serial junction;

the outermost electrode finger of the first IDT adjacent to the second IDT is connected to the unbalanced signal terminal;

the outermost electrode finger of the third IDT adjacent to the second IDT is grounded; and the outermost electrode finger of the first IDT adjacent to the second IDT is apodization weighted.

11. A surface acoustic wave filter according to claim 10, wherein the outermost electrode finger of the first IDT adjacent to the second IDT is approximately half the length of the other electrode fingers of the first IDT to achieve apodization weighting, the surface acoustic wave filter includes a dummy electrode finger that is arranged in an extension line extending from the end of the apodization weighted electrode finger, and the dummy electrode finger is provided in an area of an IDT electrode of the first IDT different from an IDT electrode of the first IDT having the apodization weighted electrode finger.

12. A surface acoustic wave filter according to claim 10, wherein the first and second outermost electrode fingers of the first IDT adjacent to the second IDT are approximately ¾ the length of the other electrode fingers of the first IDT to achieve apodization weighting, the surface acoustic wave filter includes a dummy electrode finger that is arranged in an extension line extending from the ends of the apodization weighted electrode fingers, and the dummy electrode finger is provided in an area of an IDT electrode of the first IDT different from an IDT electrode of the first IDT having the apodization weighted electrode finger.

13. A surface acoustic wave filter according to claim 10, wherein the serial junction of the second IDT is grounded.

14. A surface acoustic wave filter according to claim 10, wherein the serial junction of the second IDT is grounded through an electrode finger of one of the first IDT and the third IDT.

15. A communication apparatus comprising a surface acoustic wave filter according to claim 10.

16. A surface acoustic wave filter comprising a piezoelectric substrate, and a first reflector, a first IDT, a second IDT, a third IDT, and a second reflector, arranged on the piezoelectric substrate in that order in the direction of propagation of a surface acoustic wave, wherein the first and third IDTs, connected in parallel to each other, are connected together to an unbalanced signal terminal, and the second IDT includes two separate electrodes arranged in the direction of propagation of the surface acoustic wave, electrically connected in series with each other at a serial junction, and respectively connected to balanced signal terminals; wherein the outermost electrode fingers of the second IDT adjacent to the first IDT and the third IDT are connected to the serial junction;

the first and second outermost electrode fingers of the first IDT adjacent to the second IDT are grounded;

the outermost electrode finger of the third IDT adjacent to the second IDT is grounded, an electrode finger of the third IDT, connected to one of the unbalanced signal terminals, closest to the second IDT is approximately half the length of the other electrode fingers of the third IDT to achieve apodization weighting, and the surface acoustic wave filter includes a dummy electrode finger that is arranged in an extension line extending from the end of the apodization weighted electrode finger; and the dummy electrode finger is provided in an area of an IDT electrode of the third IDT different from an IDT electrode of the third IDT having the apodization weighted electrode finger.

17. A surface acoustic wave filter according to claim 16, wherein the serial junction of the second IDT is grounded.

18. A surface acoustic wave filter according to claim 16, wherein the serial junction of the second IDT is grounded through an electrode finger of one of the first IDT and the third IDT.

19. A communication apparatus comprising a surface acoustic wave filter according to claim 16.

\* \* \* \* \*